US 8,287,766 B2

(12) United States Patent
Petrov et al.

(10) Patent No.: US 8,287,766 B2
(45) Date of Patent: Oct. 16, 2012

(54) METHOD FOR THE APPLICATION OF ACTIVE MATERIALS ONTO ACTIVE SURFACES AND DEVICES MADE WITH SUCH METHODS

(75) Inventors: Viacheslav A. Petrov, Hockessin, DE (US); Daniel David Lecloux, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1649 days.

(21) Appl. No.: 11/154,925

(22) Filed: Jun. 16, 2005

(65) Prior Publication Data
US 2005/0269550 A1 Dec. 8, 2005

Related U.S. Application Data

(62) Division of application No. 10/669,403, filed on Sep. 24, 2003, now Pat. No. 7,686,978.

(51) Int. Cl.
| | | |
|---|---|---|
| H01L 51/50 | (2006.01) | |
| H01B 1/12 | (2006.01) | |
| C07C 43/205 | (2006.01) | |
| C09K 9/02 | (2006.01) | |
| B05D 5/12 | (2006.01) | |
| B05D 1/36 | (2006.01) | |
| B32B 9/04 | (2006.01) | |

(52) U.S. Cl. ........ 252/500; 568/654; 568/656; 568/658; 428/690; 428/917; 257/40; 313/504; 313/506

(58) Field of Classification Search .................. 252/500; 428/690, 917; 568/649, 654, 656, 658; 313/506
See application file for complete search history.

(56) References Cited

U.S. PATENT DOCUMENTS

| | | | |
|---|---|---|---|
| 3,282,875 A | | 11/1966 | James |
| 3,343,976 A | * | 9/1967 | Matlock ..................... 427/290 |
| 3,783,499 A | | 1/1974 | Hughes et al. |
| 4,358,545 A | | 11/1982 | Ezzell et al. |
| 4,940,525 A | | 7/1990 | Ezzell |
| 5,002,700 A | | 3/1991 | Otagawa et al. |
| 5,098,618 A | | 3/1992 | Zelez |

(Continued)

FOREIGN PATENT DOCUMENTS

DE 4221152 C1 11/1993
(Continued)

OTHER PUBLICATIONS

U.S. Appl. No. 10/669,403 (co-pending parent application), filed Sep. 24, 2003, Petrov et al.

(Continued)

*Primary Examiner* — Stanley Silverman
*Assistant Examiner* — Kallambella Vijayakumar

(57) ABSTRACT

The invention provides methods for the application of active materials onto active surfaces useful in organic electronic devices. The methods of the invention include selecting a liquid composition including an active material and a suitable liquid medium whereby when the liquid composition is deposited on the desired active surface it has no greater than about a 40° contact angle; treating the active surface to raise its surface tension before the deposition of a liquid composition containing the desired active material is deposited thereon; and combination thereof. The invention also provides organic electronic devices having at least two active layers, wherein at least one active layer comprises an active material that was deposited using at least one practice of the method of the invention.

5 Claims, 1 Drawing Sheet

U.S. PATENT DOCUMENTS

| | | | |
|---|---|---|---|
| 5,179,188 | A | 1/1993 | Mercer et al. |
| 5,196,140 | A | 3/1993 | Poetsch et al. |
| 5,247,190 | A | 9/1993 | Friend et al. |
| 5,271,867 | A | 12/1993 | Koden et al. |
| 5,431,850 | A | 7/1995 | Nakamura et al. |
| 5,730,922 | A | 3/1998 | Babb et al. |
| 6,031,012 | A | 2/2000 | Nakanishi et al. |
| 6,046,348 | A | 4/2000 | Yamada et al. |
| 6,124,024 | A * | 9/2000 | Hosokawa et al. ........... 428/212 |
| 6,743,948 | B1 | 6/2004 | Hosokawa et al. |
| 6,955,772 | B2 * | 10/2005 | Van den Bogaert .......... 252/500 |
| 6,994,893 | B2 * | 2/2006 | Spreitzer et al. ............. 427/469 |
| 7,252,781 | B2 | 8/2007 | Spreitzer et al. |
| 7,390,438 | B2 * | 6/2008 | Hsu et al. ..................... 252/500 |
| 7,431,866 | B2 | 10/2008 | Hsu et al. ..................... 252/500 |
| 7,462,298 | B2 | 12/2008 | Hsu et al. ................. 252/301.35 |
| 2001/0019782 | A1 | 9/2001 | Igarashi et al. |
| 2003/0030689 | A1 * | 2/2003 | Hashimoto et al. ............. 347/20 |
| 2003/0059984 | A1 * | 3/2003 | Sirringhaus et al. .......... 438/141 |
| 2004/0127666 | A1 | 7/2004 | Inbasekaran et al. |
| 2004/0206939 | A1 | 10/2004 | Spreitzer et al. |

FOREIGN PATENT DOCUMENTS

| | | | |
|---|---|---|---|
| EP | 0 656 375 A1 | | 6/1995 |
| EP | 1026152 A1 | | 8/2000 |
| EP | 1191612 A2 | | 3/2002 |
| EP | 1191614 A2 | | 3/2002 |
| GB | 1 320 648 | | 6/1973 |
| JP | 06293691 A | | 10/1994 |
| JP | 2001-81394 | | 3/2001 |
| JP | 2001081394 | * | 3/2001 |
| JP | 2002280177 A | | 9/2002 |
| JP | 2003-41192 | | 2/2003 |
| JP | 2003080694 A | | 3/2003 |
| WO | WO 88/08043 A1 | | 10/1988 |
| WO | 0202714 A2 | | 1/2002 |
| WO | 0215645 A1 | | 2/2002 |
| WO | 02072714 A1 | | 9/2002 |
| WO | WO 03/019694 A2 | | 3/2003 |
| WO | WO 03/075370 A2 | | 9/2003 |
| WO | WO 2004/060970 A1 | | 7/2004 |

OTHER PUBLICATIONS

U.S. Appl. No. 11/165,158, Now Abandoned, filed Jun. 23, 2005, Hsu et al.

U.S. Appl. No. 12/181,609 (co-pending application) Non-Final Office Action mailed on Dec. 12, 2008, filed Jul. 29, 2008, Hsu et al.

Allmer, Klas and Feiring, Andrew E., Photochemical Modification of a Fluropolymer Surface. Macromolecules, 1991, 5487-5488, 24, American Chemical Society.

Ono, Shigeru et. al, Surface Treatment of Plastic Film by Using an Atmospheric Pressure Corona Torch, Transactions of the Institute of Electrical Engineers of Japan, Part A, Inst. Electr. Eng. Japan, Aug. 2002, 722-728, 122-A (8).

Bai et al., "Preparation, characterization and photoluminescence properties of mesolamellar titanium dioxide fims," J. Material. Chem., 2001, 11, pp. 3099-3102.

Markus et al—Electronics and Nuleonics Dictionary, pp. 470-471 & 476 (McGraw-Hill 1966).

Qian et al., "Photoelectrochemical characteristics of alpha-Fe2O3 nanocrystalline semiconductor thin film," J. Nanoparticle Rersearch, 2000, 2, pp. 191-198.

Wang—Photoconductive Materials, Kirk-Othmer Encyclopedia of Chemical Technology, Fourth Edition, 1996, vol. 18 pp. 837-860.

International Search Report for Application No. PCT/US2004/031246, published as WO2005/031889, PCT counterpart to US Patent 7686978; G. Wolfbauer, Authorized Officer; May 9, 2005.

* cited by examiner

METHOD FOR THE APPLICATION OF ACTIVE MATERIALS ONTO ACTIVE SURFACES AND DEVICES MADE WITH SUCH METHODS

CROSS REFERENCE TO RELATED APPLICATIONS

This application is a divisional of application Ser. No. 10/669,403 filed Sep. 24, 2003, and now U.S. Pat. No. 7,686,978.

FIELD OF THE INVENTION

The invention relates to methods for the application of active materials for organic electronic devices onto active surfaces, and electronic devices having active materials deposited using such methods.

BACKGROUND INFORMATION

Organic electronic devices play an important role in industry. For example, organic light emitting diodes (OLEDs) are promising for display applications due to their high power conversion efficiency and low processing costs. Such displays are especially promising for battery-powered, portable electronic devices, including cell-phones, personal digital assistants, handheld personal computers, and DVD players. These applications call for displays with high information content, full color, and fast video rate response time in addition to low power consumption.

OLED's typically contain organic electroluminescent (EL) material layers arranged between an anode and a cathode. Like other organic electronic devices, an OLED may contain other active materials such as buffer layers and charge transport layers. The EL materials can be small molecule materials, such as fluorescent dyes and organometallic complexes, or larger molecule materials, such as conjugated polymers and oligomers. Each EL or active material layer contributes to the overall performance of the display. Thus, when manufacturing an organic electronic device, such as a display containing an OLED, each active material layer such as the EL material, it can be very desirable to deposit the active materials in a controlled fashion onto a suitable underlying surface.

The EL material can be applied to the OLED from a liquid medium. The deposition of the organic EL material in the liquid medium can be accomplished using a continuous method, such as spin-coating, or a discontinuous method, such as ink jet printing. The deposition method should result in complete coverage of the desired area, in order to avoid current-leakage or shorting when the device is in operation. One area currently drawing the attention of researchers is the identification of methods for precise and optimum deposition of organic EL and other active materials from a liquid medium, which in turn results in cost-efficient production of devices containing OLED displays.

SUMMARY OF THE INVENTION

In one embodiment the invention provides a method of forming an active material layer on an active surface, said method comprising:
selecting a liquid composition comprising at least one liquid medium and at least one organic active material;
selecting an active surface; and
depositing the liquid composition onto the active surface; wherein, a contact angle of the liquid composition on the surface is no greater than 40°.

In another embodiment, an active layer is formed on an active surface using the steps comprising
selecting an active surface having a first surface tension;
treating the surface resulting in a treated surface, wherein the treated surface has a second surface tension, and wherein the second surface tension is greater than the first surface tension; and
selecting a liquid composition comprising at least one liquid medium wherein said liquid medium has a surface tension that is greater than the first surface tension of the selected active surface, and at least one active material; and
depositing the liquid composition onto the treated active surface.

The invention also provides organic electronic devices having at least two active layers, wherein at least one active layer comprises an active material that was deposited using at least one practice of the method of the invention.

Other embodiments of this invention are described in the detailed description below.

DETAILED DESCRIPTION OF THE INVENTION

It has been found that in the deposition of active materials from a liquid medium onto a surface, the coverage of the deposited material is improved when the contact angle of the liquid medium on the surface is no greater than 40 degrees. In one embodiment the contact angle is no greater than 35 degrees. In a further embodiment, the contact angle is no greater than 20 degrees.

As used herein, the term "active material" is intended to mean a material which is electrically active or photoactive. Electrically active materials include conductive and semiconductive materials. The term "photoactive" refers to any material that exhibits electroluminescence, photoluminescence, and/or photosensitivity. In addition, such materials can be buffer materials, charge transport (electron or hole), or electrodes. Mixtures of active materials may also be used.

Figure 1:
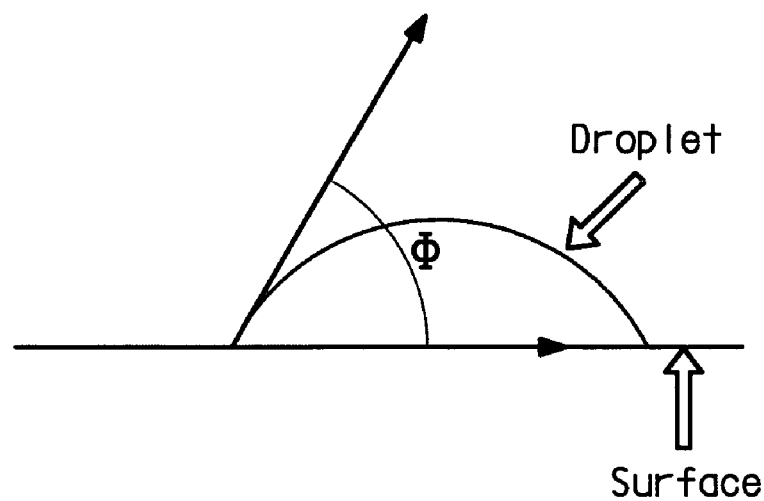
FIG. 1 is a diagram illustrating contact angle.

As used herein, the term "contact angle" is intended to mean the angle $\phi$ shown in FIG. 1. For a droplet of liquid medium, angle $\phi$ is defined by the intersection of the plane of the surface and a line from the outer edge of the droplet to the surface. Furthermore, angle $\phi$ is measured after the droplet has reached an equilibrium position on the surface after being applied, i.e. "static contact angle". A variety of manufacturers make equipment capable of measuring contact angles.

As used herein, the term "liquid medium" is intended to mean a material that is predominantly a liquid, and encompasses solutions, dispersions, emulsions, and the like.

As used herein, the term "active surface" or "active layer" is intended to mean that portion of an organic electronic device that is specifically necessary for the functioning of the device as designed. Such a surface in an organic electronic device can be a layer that includes an electrode, buffer layer, electrically active or photoactive layer, charge transport (electron or hole) layer, or in some cases materials that are placed within the organic electronic device for its electrically insulative properties. The surface may be substantially planar and may have some non-planar structural elements. The surface may be substantially non-planar, such as curved.

As used herein, the term "continuous deposition" is intended to mean a deposition method by which a surface is blanketed over the entire available surface. The term encompasses, but is not limited to, spin coating, gravure coating, curtain coating, dip coating, and slot-die coating.

As used herein, the term "discontinuous deposition" is intended to mean a deposition method by which a surface is incrementally covered patternwise. The term encompasses methods, such as, but is not limited to, ink jet printing, gravure printing, screen printing, and thermal transfer methods.

As used herein, the term "alkyl" refers to a monovalent straight or branched chain hydrocarbon group having from one to about 10 carbon atoms, including methyl, ethyl, n-propyl, isopropyl, n-butyl, isobutyl, tert-butyl, n-hexyl, and the like.

As used herein, "alkoxy" refers to the moiety —O-alkyl-, wherein alkyl is as defined above.

As used herein, "oxyalkyl" refers to alkyl moieties in which at least one —$CH_2$— unit of the alkyl moiety has been replaced by an oxygen atom.

As used herein, "alkenyl" refers to straight or branched chain hydrocarbyl groups having from 2 to about 10 carbon atoms and having one or more carbon-carbon double bonds.

As used herein, "oxyalkenyl" refers to alkenyl moieties in which at least one —$CH_2$— unit of the alkenyl moiety has been replaced by an oxygen atom.

As used herein, "fluorinated", when used to describe an alkyl, alkenyl, oxyalkyl, or oxyalkenyl, means that at least one hydrogen atom of the alkyl, alkenyl, oxyalkyl, or oxyalkenyl moiety has been replaced with a fluorine atom.

As used herein, "perfluorinated" refers to an alkyl, alkenyl, oxyalkyl, or oxyalkenyl moiety in which each and every hydrogen atom has been replaced with a fluorine atom.

As used herein, the term "$R_f$" refers to a perfluorinated group.

The IUPAC numbering system is used throughout, where the groups from the Periodic Table are numbered from left to right as 1-18 (CRC Handbook of Chemistry and Physics, 81$^{st}$ Edition, 2000).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The term "organic electronic device" is intended to mean a device including one or more semiconductor layers or materials. Organic electronic devices include: (1) devices that convert electrical energy into radiation (e.g., a light-emitting diode, light-emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy (e.g., a photovoltaic device or solar cell), and (4) devices that include one or more electronic components that include one or more organic semi-conductor layers (e.g., a transistor or diode).

As used herein, the terms "liquid medium" and "liquid composition" are intended to mean a material that is predominantly a liquid; and encompasses solutions, dispersions, suspensions, emulsions and the like.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

In general, if a liquid medium has a contact angle on a given surface that is higher than about 40°, this is because the surface tension of the liquid medium is too high relative to the surface tension of the surface. Thus, a desired contact angle can be achieved by either lowering the surface tension of the liquid medium, or raising the surface tension of the surface.

In one embodiment, the desired contact angle of the liquid composition which contains at least an active material and at least one liquid medium, when deposited on an active surface, can be achieved by choosing a liquid medium or combination of liquid medium for the liquid medium which has an appropriately low relative surface tension. The liquid medium or combination of liquid medium used in the liquid composition should have sufficient compatibility with the active material so that the active material can be uniformly applied. In general, the active material is dissolved, dispersed, emulsified, or suspended in the liquid medium or combination of liquid mediums. Acceptable liquid medium must be compatible with the active material to keep such material in suspension, solution, or in its emulsified dispersed state until application in the manufacture of the organic electronic device. Useful solvents for this invention include toluene, xylene, mesitylene, chlorobenzenes, alkylbenzenes, cyclohexanes, amides, keytones, lactones, alkanes (cyclic, linear, or branched), ethers, alcohols, cyclic ethers, nitriles, sulfoxides and mixtures thereof. If the active material or the active surface are not sensitive to water, water may also be used in the liquid medium.

In one embodiment, the desired contact angle of the liquid medium on the surface, can be achieved by adding an additional material to the liquid medium that will lower the surface tension. In general, the addition of surfactants will lower the surface tension, including fluro-surfactants In one embodiment, the desired contact angle of the liquid medium on the active surface, can be achieved by treating the active surface with at least one treatment to increase the surface tension. Oxidizing treatments can be used. Examples of treatments include, but are not limited to, chemical etching, electrochemical reduction, atmospheric pressure discharge for example corona discharge, plasma etching, ion beam bombardment, electron beam bombardment, laser ablation, metal induced crystallization, and photochemical modification. The surface tension of the surface can also be treated by adding a thin adhesion layer having a higher surface tension. Examples of such adhesion layers include, but are not limited to, metal oxides and hydrophilic polymers. In general, any organic substance that both can be applied as a suitably thin layer and that has a surface tension greater than that of the active surface layer may suitable for use in an adhesion layer. Combinations of active surface treatments may be used, or combinations of active surface treatment(s) and selection the appropriate liquid medium for the active material which is desired to be deposited on a active surface.

The invention will be further described in terms of its application in an electronic device, although it is not limited to such application.

Figure 2:
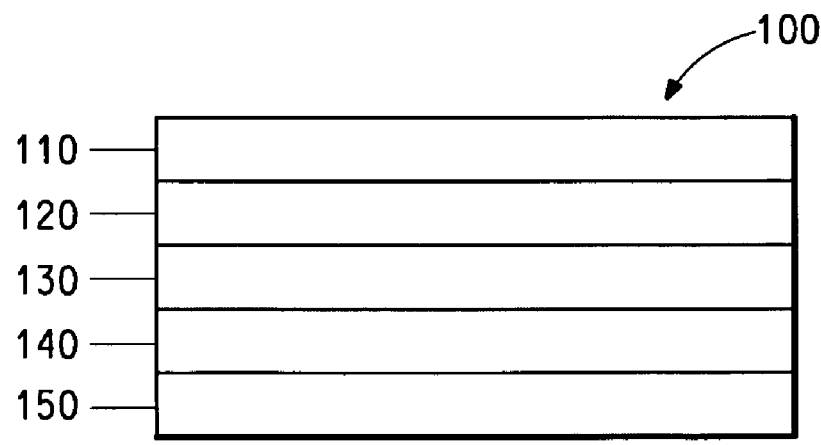
FIG. 2 is an exemplary electronic device.

FIG. 2 is an exemplary electronic device, an organic light-emitting diode (OLED) display wherein, 100 that includes a photoactive layer positioned between two electrical contact layers. The electronic device 100 includes a hole transport layer 120 located between the photoactive layer 130 and an anode layer 110. An optional electron transport layer 140 is located between the photoactive layer 130 and a cathode layer 150. Depending on the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, phototubes, and photovoltaic cells, as described in Markus, John, *Electronics and Nucleonics* Dictionary, 470 and 476 (McGraw-Hill, Inc., 1966). The device is not limited with respect to system, driving method, and utility mode.

The method of the invention can be used to apply any of the layers of the device onto another. In one embodiment, the method of the invention is used to apply the photoactive layer 130 to the hole injection layer 120.

The hole injection layer 120 is typically a conducting polymer and facilitates the injection of holes from the anode into the photoactive layer. The hole injection layer can also be called a hole transport layer, a buffer layer, or may be characterized as part of a bilayer anode. Typical conducting polymers employed as hole injection layers include polyaniline and polydioxythiophenes such as poly(3,4-ethylenedioxythiophene) (PEDT).

In one embodiment, the electronic device 100 is an organic electronic device having a hole injection layer comprising a polyaniline ("PANI") and a colloid-forming polymeric acid, as described in co-pending application Ser. No. 10/669,577 (now U.S. Pat. No. 7,462,298) a polythiophene and a colloid-forming polymeric acid, and a polydioxythiophene and a colloid-forming polymeric acid as described in co-pending application Ser. No. 10/669,494 (now U.S. Pat. No. 7,431,866) onto which an active material is deposited using the method of the present invention. In some embodiments, the active surface comprises a material selected from polyaniline combined with a fluorinated polymeric sulfonic acid, a polythiophene combined with a fluorinated polymeric sulfonic acid, a poly(dioxythiophene) combined with a fluorinated polymeric sulfonic acid, and mixtures thereof.

The polyaniline is generally formed from aniline monomers having Formula I below.

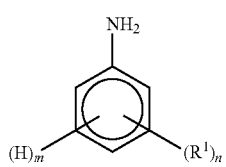

(I)

where in Formula I:
n is an integer from 0 to 4;
m is an integer from 1 to 5, with the proviso that n+m=5; and $R^1$ is independently selected so as to be the same or different at each occurrence and is selected from alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

Colloid-forming polymeric acids contemplated for use with PAni are insoluble in water, and form colloids when dispersed into an aqueous medium. The polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any polymeric acid that is colloid-forming when dispersed in water is suitable for use. Other acceptable polymeric acids include polymer sulfonic acids, polymeric phosphoric acids, polymeric carboxylic acids, polymeric acrylic acids, and mixtures thereof, including mixtures having polymeric sulfonic acids. The polymeric sulfonic acid can be fluorinated which include both perfluorinated and highly-fluorinated sulfonic (("FSA polymer") acid polymer sulfonic acids. An example of one specific colloid-forming polymeric sulfonic acid is a perfluoroalkylene-sulfonic acid.

"Highly fluorinated" means that at least about 50% of the total number of halogen and hydrogen atoms in the polymer are fluorine atoms, and it one embodiment at least about 75%, and in another embodiment at least about 90%. In another embodiment, the polymer is perfluorinated. The term "sulfonate functional group" refers to either to sulfonic acid groups or salts of sulfonic acid groups, and in one embodiment alkali metal or ammonium salts. The functional group is represented by the formula —$SO_3X$ where X is a cation, also known as a "counterion". X may be H, Li, Na, K or $N(R_1)(R_2)(R_3)(R_4)$, and $R_1$, $R_2$, $R_3$, and $R_4$ are the same or different and are in one embodiment H, $CH_3$ or $C_2H_5$. In one embodiment, X is H, in which case the polymer is said to be in the "acid form". X may also be multivalent, as represented by such ions as $Ca^{++}$, and $Al^{+++}$. It is clear to the skilled artisan that in the case of multivalent counterions, represented generally as $M^{n+}$, the number of sulfonate functional groups per counterion will be equal to the valence "n".

One such FSA polymer comprises a polymer backbone with recurring side chains attached to the backbone, the side chains carrying cation exchange groups. Polymers include homopolymers or copolymers of two or more monomers. Copolymers are typically formed from a nonfunctional monomer and a second monomer carrying the cation exchange group or its precursor, e.g., a sulfonyl fluoride group (—$SO_2F$), which can be subsequently hydrolyzed to a sulfonate functional group. For example, copolymers of a first fluorinated vinyl monomer together with a second fluorinated vinyl monomer having a sulfonyl fluoride group (—$SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro (alkyl vinyl ether), and combinations thereof. TFE is a preferred first monomer.

Possible second monomers include fluorinated vinyl ethers with sulfonate functional groups or precursor groups which can provide the desired side chain in the polymer. Additional monomers, including ethylene, propylene, and R—CH=$CH_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

Other FSA polymers for include a highly fluorinated, including those that are perfluorinated, carbon backbone and side chains represented by the formula

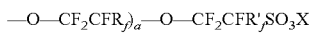

wherein Rf and R'f are independently selected from F, Cl or a perfluorinated alkyl group having 1 to 10 carbon atoms, a=0, 1 or 2, and X is H, Li, Na, K or N(R1)(R2)(R3)(R4) and R1, R2, R3, and R4 are the same or different and in one embodiment are H, $CH_3$ or $C_2H_5$. In another embodiment X is H. As stated above, X may also be multivalent.

The preferred FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

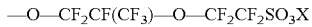

where X is as defined above. FSA polymers of this type are disclosed in U.S. Pat. No. 3,282,875 and can be made by copolymerization of tetrafluoroethylene (TFE) and the perfluorinated vinyl ether $CF_2$=CF—O—$CF_2CF(CF_3)$—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a preferred polymer of the type disclosed in U.S. Pat. Nos. 4,358,545 and 4,940,525 has the side chain —O—$CF_2CF_2SO_3X$, wherein X is as defined above. This polymer can be made by copolymerization of tetrafluoroethylene (TFE) and the perfluorinated vinyl ether $CF_2$=CF—O—$CF_2CF_2SO_2F$, perfluoro(3-oxa-4-pentenesulfonyl fluoride) (POPF), followed by hydrolysis and further ion exchange as necessary.

The FSA polymers for use in this invention have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. With most polymers, the IXR is about 3 to about 33, and in one embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—$CF_2$—$CF(CF_3)$—O—$CF_2$—$CF_2$—$SO_3H$ (or a salt thereof, the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940, 525, e.g., the polymer having the side chain —O—$CF_2CF_2SO_3H$ (or a salt thereof, the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

Aqueous dispersions of FSA polymer are available commercially as Nafion® dispersions, from E. I. du Pont de Nemours and Company (Wilmington, Del.).

The electrically conducting polyanilines are typically prepared by oxidatively polymerizing aniline or substituted aniline monomers in an aqueous colloid-forming polymeric acid dispersion in the presence of an oxidizing agent, such as ammonium persulfate (APS), sodium persulfate, potassium persulfate and the like. The aqueous dispersion contains at least enough of a suitable colloid-forming polymeric acid to form base/acid salts with the emeraldine base of polyaniline, wherein formation of the acid/base salt renders the polyanilines electrically conductive conductive. The polymerization can also be carried out in the presence of a co-dispersing liquid, such as an alcohol, and a co-acid, such as HCl.

Polydioxythiophenes that are useful in electronic devices typically have the structure:

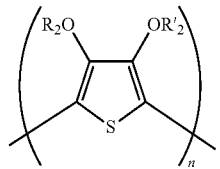

wherein:
$R_2$ and $R_2'$ are each independently selected from hydrogen an alkyl having 1 to 4 carbon atoms,
or $R_1$ and $R_1'$ taken together form an alkylene chain having 1 to 4 carbon atoms, which may optionally be substituted by alkyl or aromatic groups having 1 to 12 carbon atoms, or a 1,2-cyclohexylene radical, and
n is greater than about 6.

In a particular embodiment, $R_2$ and $R_2'$ taken together form an alkylene chain having 1 to 4 carbon atoms. In another embodiment, the polydioxythiophene is poly(3,4-ethylenedioxythiophene) ("PEDOT").

When polythiophene is used, the structure is as above with the replacement of the "$R_2O$" and "$OR'_2$" groups with $R_2$ and $R_2'$.

When polythiopene is used, the structure is as above with the replacement of the "$R_2O$" and "$OR'_2$" is $R_2$ and $R_2'$.

The colloid-forming polymeric acids are as described above.

The electrically conducting polythiophenes, and polydioxythiophenes are generally prepared by oxidatively polymerizing thiopene and dioxythiophene monomers in the presence of water containing polymeric acid colloids. Typically, the polythiophene dioxythiophene monomers are added to an aqueous dispersion containing a polymerization catalyst, an oxidizing agent, and colloidal polymeric acid particles dispersed therein. Co-acids and co-dispersing solvents may also be used.

The active material in layer 130 for an OLED can include all known electroluminescent materials, including, but not limited to, fluorescent dyes, fluorescent and phosphorescent metal complexes, conjugated polymers, and mixtures thereof.

Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum ($Alq_3$); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Examples of conjugated polymers include, but are not limited to poly(phenylenevinylenes), polyfluorenes, poly(spirobifluorenes), copolymers thereof, and mixtures thereof.

In the manufacture of certain OLEDs, photoactive polymers are typically dissolved is solvents such as xylene or toluene and applied to the hole injection layer by conventional solution coating techniques. However, the contact angle of these solutions of photoactive polymer on a fluorinated hole injection layer is generally greater than about 40° and the solutions do not wet the surface well. Thus, applying the photoactive polymer from the above-described solutions can result in films with voids due to poor wetting of the surface.

In one embodiment of the invention, this difficulty is overcome by dispersing the active material in a liquid medium that has a surface tension that is suitable to working with the active surface to which it is to be applied. In addition to selecting a liquid medium with a suitable surface tension for any particular active surface, the active surface may also be treated to raise its surface tension by either treating the active surface layer to raise its surface tension or applying an adhesion layer to the active surface layer, or a combination of both treatments. Relative surface tension is indicated by the contact angle. A lower contact angle indicates a raised surface tension.

When the active surface layer has a surface tension that does not permit precise or optimum deposition of the active material, for example, when the active surface contains a fluorinated material, one embodiment of the present invention is to disperse the active material in a liquid medium comprising at least one fluorinated liquid. The resulting dispersed active material composition can then be deposited onto the desired active surface, provided that a contact angle of the dispersed composition on the active surface is no greater than 40°.

When the active surface layer contains a fluorinated material, one embodiment of the present invention is to dissolve, suspend or disperse the active material to be deposited on such an active surface in a liquid medium comprising at least one fluorinated liquid. In some embodiments, the active surface layer comprises an active material combined with a fluorinated polymeric sulfonic acid. In some embodiments, the active surface layer comprises a material selected from polyaniline combined with a fluorinated polymeric sulfonic acid, a polythiophene combined with a fluorinated polymeric sulfonic acid, a poly(dioxythiophene) combined with a fluorinated polymeric sulfonic acid, and mixtures thereof. The fluorinated liquid mediums used in this invention can be used alone, or in combination with other liquids, where the other liquids can be fluorinated or non-fluorinated. When mixtures of fluorinated liquid mediums are used in this invention, the fluorinated liquid mediums may be from about 5 to about 95% by volume and in one embodiment is no more than 50% fluorinated liquid medium. The photoactive material can be dissolved, suspended or dispersed in the liquid medium comprising a fluorinated liquid, or combination of liquids, to the extent that the composition is film-forming. Examples of suitable fluorinated liquids include, but are not limited to, trifluoromethylbenzene, 1,3-bis(trifluoromethylbenzene), trifluoromethoxybenzene, and others provided in Table 1, and mixtures thereof.

In one embodiment, the fluorinated liquid medium is a compound having the structure:

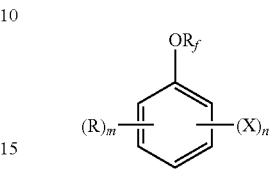

wherein:

$R$ is $C_1$-$C_{10}$ alkyl, $C_1$-$C_{10}$ alkoxy, or $C_1$-$C_{10}$ oxyalkyl, $R_f$ is $C_1$-$C_{10}$ fluorinated alkyl, $C_1$-$C_{10}$ fluorinated alkenyl, $C_1$-$C_{10}$ fluorinated oxyalkyl, or $C_1$-$C_{10}$ fluorinated oxyalkenyl, X is H, F, Cl, Br, $C_1$-$C_{10}$ alkyl, $C_1$-$C_{10}$ alkoxy $C_1$-$C_{10}$ oxyalkyl, $C_1$-$C_{10}$ fluorinated alkyl, $C_1$-$C_{10}$ fluorinated alkenyl, $C_1$-$C_{10}$ fluorinated oxyalkyl, or $C_1$-$C_{10}$ fluorinated oxyalkenyl, m is from 0-5, and n is from 0-5, wherein m+n is no greater than 5.

In other embodiments, R and X are each independently $C_1$-$C_{10}$ alkyl or $C_1$-$C_{10}$ alkoxy.

In certain other embodiments, $R_f$ is a $C_1$-$C_3$ fluorinated alkyl, such as, for example, —$CF_2CF_2H$.

Exemplary fluorinated aryl ethers contemplated for use in the practice of the invention include, but are not limited to:

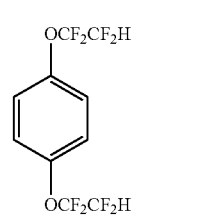

A

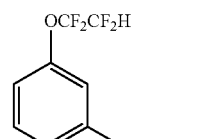

B

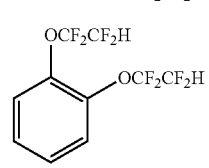

C

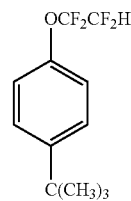

D

-continued

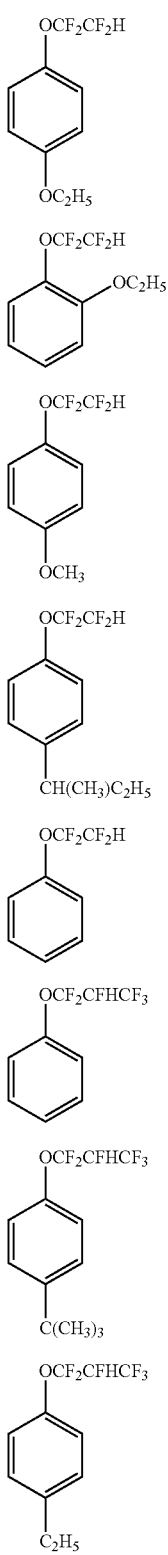

F

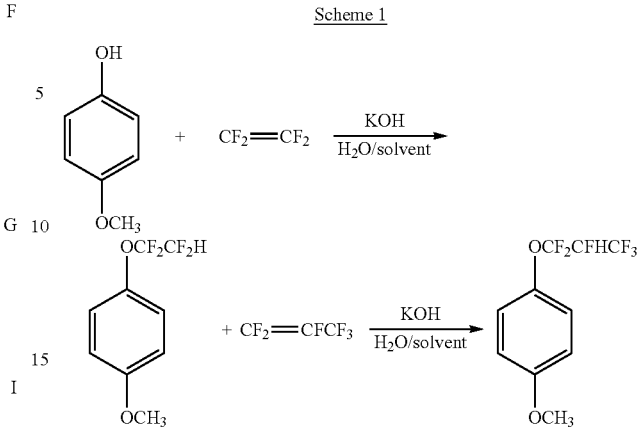

Scheme 1

Fluorinated liquids of this type can be prepared by a variety of methods known to those skilled in the art. For example, aryl-1,1,2,2-tetrafluoroethyl ethers were made using procedure reported in GB Patent 1,320,648 (1973) by reacting the appropriate phenol with tetrafluoroethylene in the presence of base, in water-mixable solvent, as shown in Scheme 1 below.

Scheme 1 depicts a reaction between a phenol and a suitable fluorinated olefin in the presence of a base catalyst, resulting in the corresponding fluorinated arylether. The reactions outlined above employ a $C_2$ and a $C_3$ fluorinated olefin, i.e., tetrafluoroethylene and hexafluoropropylene, respectively, however, it is understood that any $C_1$-$C_{10}$ fluorinated olefin is suitable for use in preparing new fluorinated aryl ethers. Aryl-1,1,1,2,3,3-hexafluoropropyl ethers M, N and O were prepared similarly, by reacting phenolic compound in the presence of base with hexafluoropropene, instead of tetrafluoroethylene. It should be pointed out, that in this case isolated product contained 6-8% of unsaturated material [$CF_3CF$=$CFOAr$], forming in the reaction as byproduct. The reaction set forth in Scheme 1 is typically carried out in polar solvents or polar solvent mixtures, such as, for example, water, water/acetonitrile, and the like. The reaction is typically carried out at a temperature of at least about 80° C. for about 10-15 hours. Reaction conditions and boiling points of polyfluorinated aryl ethers are given in Table 1 of Example 1.

In one embodiment of the invention, an organic electronic device comprises a first active material layer having a surface capable of receiving a layer of another active material and having a first surface tension; and wherein the surface of the first active material layer (aka, having the active surface) is treated to increase its surface tension the and said treatment method comprising:

treating the active surface to form a treated active surface having a second surface tension, wherein the second surface tension is greater than the first surface tension;

creating a liquid composition of an active material in a liquid medium;

depositing the liquid composition onto the treated active surface.

In one embodiment, a contact angle of the liquid composition on the treated active surface is no greater than 40°.

The active surface may be treated by numerous methods and combinations thereof. Such treatment methods include chemical etching, electrochemical reduction, corona discharge, plasma etching, ion beam bombardment, electron beam bombardment, laser ablation, photochemical treatment, as described by Feiring et al., Macromolecules 1991, 24, 5487-5488, and combinations thereof. The treatment may also include is plasma etching with gases at low pressures. In one embodiment the plasma gas comprises a gas selected from $NH_3$, $NH_3$/Ar, He, and Ar and mixtures thereof. In one embodiment, the plasma pressure is less than 10 Torr. In another embodiment, the plasma pressure is near atmospheric pressure (760 Torr).

The active surface may also be treated with by applying an adhesion layer to increase the surface tension. The adhesion layer can comprise any material having a surface tension high enough so that the liquid composition comprising the photoactive material will wet the surface, so long as the material does not deleteriously affect the function (e.g., conductivity, charge transport performance) of the active surface.

In addition, any of the above treatments can be used in combination. The adhesion layer can be an organic layer or an inorganic layer. Metal chelated oxinoid compounds such as Alq3 can be used.

In one embodiment the adhesion layer comprises at least one hole transport material. Examples of hole transport materials which may be used have been summarized, for example, in Kirk-Othmer Encyclopedia of Chemical Technology, Fourth Edition, Vol. 18, p. 837-860, 1996, by Y. Wang. Both hole transporting small molecules and polymers can be used. Examples of hole transporting small molecules include, but are not limited to: N,N'-diphenyl-N,N'-bis(3-methylphenyl)-[1,1'-biphenyl]-4,4'-diamine (TPD), 1,1-bis[(di4-tolylamino) phenyl]cyclohexane (TAPC), N,N'-bis(4-methylphenyl)-N,N'-bis(4-ethyl phenyl)-[1,1'-(3,3'-dimethyl) biphenyl]4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino) benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino) styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), and porphyrinic compounds, such as copper phthalocyanine, and combination thereof.

The hole transporting small molecules can be vapor deposited over the fluorinated hole injection layer, or they can applied by liquid deposition in combination with a film-forming polymeric material such as polystyrene, polycarbonate, or polyvinylcarbazole. Examples of hole transporting polymers include, but are not limited to: polyvinylcarbazole; (phenylmethyl)polysilane; polyanilines complexed with polymeric acids such as poly(styrenesulfonic acid) ("PSSA"), poly(2-acrylamido-2-methyl-1-propanesulfonic acid) ("PAAMPSA"), and the like; poly(dioxythiophenes), such as poly(3,4-ethylenedioxythiophene), complexes with polymeric acids such as PSSA and PAAMPSA; and mixtures thereof.

The polymeric materials can be applied by dispersing or suspending them in a liquid and using conventional deposition techniques. In one embodiment, in order to apply the adhesion layer from a liquid composition onto the active surface layer being treated, the liquid composition is applied by a forced-spreading method, such as spin coating.

Inorganic adhesion layers can be metals, such as silver, or metal oxides, such as alumina, and combinations thereof which are applied by vapor deposition of the oxide directly or by vapor deposition of the metal followed by oxidation in air or oxygen plasma. It is contemplated that more than one adhesion layer may be useful and different materials may be used in each layer.

In general, the adhesion layer is very thin. In one embodiment, the adhesion layer (or combination of layers) is less than 100 nm. In one embodiment, the adhesion layer(s) is less than 10 nm. In general, adhesion layers comprising materials that do not have hole transporting properties are much thinner. In one embodiment, layers of these non-hole transport active materials are less than 5 nm.

The other layers in the device can be made of any materials which are known to be useful in such layers. The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole. The IUPAC number system is used throughout, where the groups from the Periodic Table are numbered from left to right as 1-18 (CRC Handbook of Chemistry and Physics, 81$^{st}$ Edition, 2000).

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, Li$_2$O, or the like.

The cathode 150, is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process.

In other embodiments, additional layer(s) may be present within organic electronic devices.

The different layers may have any suitable thickness. Inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 1000 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or voltaic cells). Examples of electronic devices that may respond to radiant energy are selected from photoconductive cells, photoresistors, photoswitches, biosensors, phototransistors, and phototubes, and photovoltaic cells. After reading this specification, skilled artisans will be capable of selecting material(s) that are suitable for their particular applications.

The invention will now be described in greater detail by reference to the following non-limiting examples.

EXAMPLES

Example 1

This Example describes a typical protocol for preparing new fluorinated arylethers which have low surface tension. The arylethers can be used for dispersing photoactive materials and applying them to fluorinated hole injection layers.

A 400 mL Hastelloy shaker tube was charged with a mixture of water, acetontrile, and KOH, and was then cooled down to −50° C. The tube was evacuated, charged with a fluorinated olefin (in the Examples set forth in Table 1, the fluorinated olefin is either tetrafluoroethylene or hexafluoropropylene; commercially available, DuPont) and maintained at a temperature of 80-150° C. for 1-14 h. The reaction mixture was then diluted with water (500-600 mL), and extracted with $CH_2Cl_2$ (100 mL). After separation the organic layer was washed with 10% NaOH solution (500 mL×3), and dried over $MgSO_4$. The solvent was removed under vacuum and the liquid residue was distilled under reduced pressure. Table 1 sets forth experimental data used to produce thirteen fluorinated arylethers according to the invention.

TABLE 1

|   |   | Phenol/ olefin (mol) | Catalyst (mol) | $CH_3CN$/ water (mL) | Temp. (° C.) | Time (h) | Yield (%) | B.P. (° C.)/ mm Hg |
|---|---|---|---|---|---|---|---|---|
| 1 | A | 0.2/0.5 | KOH (0.17) | 50/100 | 130 | 14 | 70 | 80-81/10 |
| 2 | B | 0.2/0.5 | KOH (0.17) | 50/100 | 130 | 14 | 77 | 43-44/0.17 |
| 3 | C | 0.2/0.5 | KOH (0.17) | 50/100 | 130 | 14 | 81 | 39-40/0.1 |
| 4 | D | 0.4/0.5 | KOH (0.17) | 50/100 | 150 | 14 | 77 | 46-47/0.14 |
| 5 | E | 0.5/0.5 | KOH (0.17) | 50/100 | 150 | 14 | 68 | 18-22/0.8 |
| 6 | F | 0.4/0.5 | KOH (0.17) | 50/100 | 150 | 14 | 66 | 80-81/12 |
| 7 | G | 0.4/0.5 | KOH (0.17) | 50/100 | 150 | 14 | 45 | 24-25/0.1 |
| 8 | I | 0.4/0.5 | KOH (0.17) | 50/100 | 150 | 14 | 33 | 40/0.1 |
| 9 | K | 0.4/0.5 | KOH (0.17) | 50/100 | 150 | 14 | 53 | 42-44/0.1 |
| 10 | L | 0.5/0.5 | KOH (0.17) | 50/100 | 150 | 14 | 68 | 19-22/0.1 |
| 11 | M | 0.5/0.5 | KOH (0.17) | 50/100 | 80 | 12 | 76 | 54-55/12 |
| 12 | N | 0.2/0.2 | KOH (0.17) | 50/100 | 80 | 12 | 69 | 52/0.2 |
| 13 | O | 0.2/0.2 | KOH (0.08) | 50/100 | 80 | 12 | 63 | 38-40/0.5 |

Example 2

This example illustrates the measurement of contact angles of fluorinated solvent (blends) on a low surface tension active surface (film) containing a fluorinated polymeric sulfonic acid (described above).

The low surface tension FSA film was formed by spin coating an ~2.8 wt % aqueous dispersion of this composition at 800 rpm onto an indium tin oxide (glass) substrate (purchased from Applied Films). After drying at 90° C. in vacuo for 0.5 h, the resulting film measured 80 nm thick with an average roughness <2 nm, as judged by analysis with an atomic force microscope.

Contact angle analysis was carried out on the active layer, using a wafer surface analysis system, VCA 3000S, from AST Products, Inc. contact angle analyzer equipment was used. For each experiment, a 3 drops of liquid medium (solvent) was placed on the polymer film using a microsyringe, and within five seconds its equilibrium position on the surface was reached. At this point the static contact angle measurement was taken. In each case 4 to 6 measurements were taken at fresh locations on the film, and an average was taken to provide the final values. Table 2 lists the fluorinated solvent (blends) that were screened along with their contact angles on the FSA polymer film. 1-Phenylhexane (Aldrich Chemical Co.) was used as a non-fluorinated (higher surface tension) standard; it's static contact angle on the FSA film was 52 degrees.

TABLE 2

| Compound | Supplier/Notebook # | Contact Angle (deg) on FSA Film (+/−2 Deg.) |
|---|---|---|
| 1-Phenylhexane | Aldrich | 52 |
| Trifluoromethylbenzene (TFMB) | Aldrich | 25 |
| TFMB/1-phenylhexane (1:1) | | |
| TFMB/1-phenylhexane (1:2) | | |
| 1,4-bis(tetrafluoroethoxy)benzene | | 38 |
| Trifluoromethoxybenzene | Aldrich | 15 |
| 4-OMe-tetrafluoroethoxybenzene | 105028-121-2 | 49 |
| 4-Et-tetrafluoroethoxybenzene | E105028-141A | 37 |
| 2-Et-tetrafluoroethoxybenzene | E105028-141 | 40 |
| tetrafluoroethoxybenzene | 105028-122-2,3 | 40 |
| 1,3-bis(trifluoromethyl)benzene | Aldrich | 5 |
| 1,3-bis(tetrafluoroethoxy)benzene | E105028-101-2 | 37 |
| 1,2-bis(tetrafluoroethoxy)benzene | E105028-131-2,3 | 37 |
| 4-sec-Bu-tetrafluoroethoxybenzene | E105028-142A-3 | 41 |
| 4-tert-Bu-tetrafluoroethoxybenzene | E105028-142-2 | 42 |
| 2-ethoxy-tetrafluoroethoxybenzene | E105028-143-2 | 49 |
| hexafluoropropyloxybenene | E106451-12-2 | 27 |

Example 3

This example illustrates the use of exposing a FSA-containing polymer active surface to a plasma gas to chemically modify the active surface and thereby raise the surface tension of the film. Such modification enhances the wettability of the active surface with standard aromatic coating solvents.

FSA-containing films were spin-coated on ITO, and resulting thicknesses were determined as described for Example 2. Film thickness was adjusted from 80-200 nm by controlling spin-coating variables. At this point the film was placed in a PlasmaTherm plasma gas generating chamber. The plasma exposure protocol using this equipment is as follows: (1) The chamber was pumped down to 1 e-5 Torr and then purged with inert gas to remove residual air; (2) The film was then exposed to a plasma gas mixture at approx. 400 mTorr total pressure at 55° C. and at a particular power setting and time exposure; (3) Finally the chamber was vented, and the resulting modified films were studied by contact angle (Measured as described for Example 2 using 100% 1-phenylhexane as the standard liquid medium) and X-ray-photoelectron spectroscopic analysis. This procedure was repeated using various gas mixtures and plasma power and time exposures on FSA-containing polymer films of varying thickness. Gas mixtures used, resulting contact angles, and film thicknesses are summarized in Table 3.

TABLE 3

| TREATMENT | CONTACT ANGLE | FILM THICKNESS |
|---|---|---|
| No Treatment | 52.4° | 2000 Å |
| HMDS | 51.0° | 2000 Å |
| He 25 W, 1 min | 14.1° | 2000 Å |
| He/NH3 25 W, 1 min | 7.9° | 2000 Å |
| He/N2/NH3 25 W, 1 min | 13.5° | 2000 Å |
| He 10 W, 1 min | 8.5° | 2000 Å |
| He 15 W, 1 min | 8.4° | 2000 Å |
| He 25 W, 1 min | 11.9° | 2000 Å |
| He/NH3 10 W, 1 min | 9.4° | 2000 Å |
| He/NH3 15 W, 1 min | 11.3° | 2000 Å |
| He/NH3 25 W, 1 min | 13.1° | 2000 Å |
| He 7 W, 1 min | 16.2° | 2000 Å |
| He/NH3 7 W, 1 min | 13.9° | 2000 Å |
| He/NH3, 0 W, 1 min | 51.1° | 2000 Å |
| He, 10 W, 5 secs | 52.3° | 2000 Å |
| He, 10 W, 10 secs | 50.7° | 2000 Å |
| He, 10 W, 15 secs | 47.6° | 2000 Å |
| He, 10 W, 30 secs | 40.6° | 2000 Å |
| He/NH3, 10 W, 5 secs | 49.7° | 750 Å |
| He/NH3, 10 W, 10 secs | 45.9° | 750 Å |
| He/NH3, 10 W, 15 secs | 43.5° | 750 Å |
| He/NH3, 10 W, 30 secs | 31.7° | 750 Å |
| UV-Ozone, 5 secs | 53.9° | 750 Å |
| UV-Ozone, 15 secs | 53.9° | 750 Å |
| Uv-Ozone, 30 secs | 54° | 750 Å |

Example 4

This example illustrates the use of a thin adhesion layer on the FSA-containing active surface (film) to improve its wettability with common aromatic coating solvents. FSA-containing films were prepared as described in Examples 2-3; all film thicknesses were 200 nanometers. A sample was then placed in a thermal evaporation chamber, and the pressure was reduced to 2e-7 Torr. At this point either tris-(8-hydroxyquinoline) aluminum (AlQ, Aldrich) or copper(phthalocyanine) (Aldrich) was thermally evaporated onto the FSA-containing film to a specified thickness. The chamber was vented, and the resulting bilayer film was studied by contact angle analysis. The various adhesion layer thicknesses used and the resulting contact angles, with 100% 1-phenylhexane as the standard liquid medium, are summarized in Table 4.

TABLE 4

| ADHESION LAYER TYPE | ADHESION LAYER THICKNESS (Å) | CONTACT ANGLE |
|---|---|---|
| AlQ3 | 0 | 52 |
| AlQ3 | 10 | 34 |
| AlQ3 | 25 | 24 |
| AlQ3 | 50 | 10 |
| CuPc | 0 | 52 |
| CuPc | 10 | 50 |
| CuPc | 25 | 40 |
| CuPc | 50 | 4 |
| CuPc | 100 | 4 |
| CuPc | 250 | 4 |

What is claimed is:

1. A method of forming an active material layer on an active surface, said method comprising;
   selecting an active surface comprising a fluorinated material;
   selecting a liquid composition comprising at least one liquid medium and at least one active material; and
   depositing the liquid composition onto the active surface, wherein, the liquid medium comprises at least one fluorinated compound.

2. A method according to claim 1, wherein the active surface comprises a material selected from polyaniline combined with a fluorinated polymeric sulfonic acid, a polythiophene combined with a fluorinated polymeric sulfonic acid, a poly(dioxythiophene) combined with a fluorinated polymeric sulfonic acid, and mixtures thereof.

3. A method according to claim 2, wherein the liquid medium comprises at least one compound that is selected from compounds having the structure

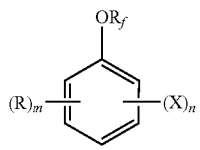

wherein:
R is $C_1$-$C_{10}$ alkyl, $C_1$-$C_{10}$ alkoxy, or $C_1$-$C_{10}$ oxyalkyl,
$R_f$ is $C_1$-$C_{10}$ fluorinated alkyl, $C_1$-$C_{10}$ fluorinated alkenyl, $C_1$-$C_{10}$ fluorinated oxyalkyl, or $C_1$-$C_{10}$ fluorinated oxyalkenyl,
X is H, F, Cl, Br, $C_1$-$C_{10}$ alkyl, $C_1$-$C_{10}$ alkoxy $C_1$-$C_{10}$ oxyalkyl, $C_1$-$C_{10}$ fluorinated alkyl, $C_1$-$C_{10}$ fluorinated alkenyl, $C_1$-$C_{10}$ fluorinated oxyalkyl, or $C_1$-$C_{10}$ fluorinated oxyalkenyl,
m is from 0-5, and
n is from 0-5, wherein m+n is no greater than 5.

4. A method according to claim 3, wherein the liquid medium comprises a material selected from compounds A through O and mixtures thereof:

A
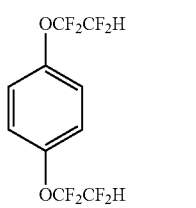

B
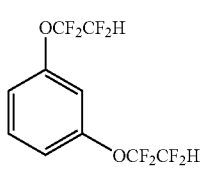

C
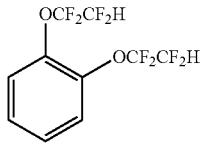

D
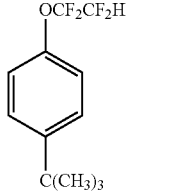

F
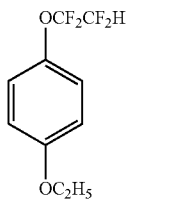

G
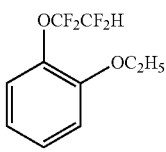

I
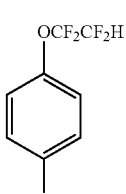

K
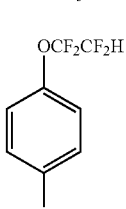

L
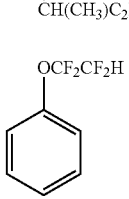

M
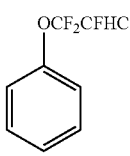

N
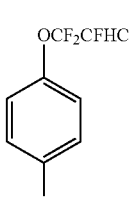

O
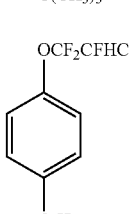

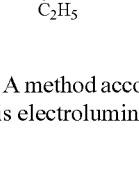

5. A method according to claim 1, wherein the active material is electroluminescent.

* * * * *